US008833253B2

(12) United States Patent
Okawa et al.

(10) Patent No.: US 8,833,253 B2
(45) Date of Patent: Sep. 16, 2014

(54) MASK HOLDER

(75) Inventors: Koji Okawa, Yamanashi (JP); Yusuke Sueyasu, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/996,722

(22) PCT Filed: Sep. 11, 2012

(86) PCT No.: PCT/JP2012/005766
§ 371 (c)(1),
(2), (4) Date: Jun. 21, 2013

(87) PCT Pub. No.: WO2013/084388
PCT Pub. Date: Jun. 13, 2013

(65) Prior Publication Data
US 2014/0053743 A1    Feb. 27, 2014

(30) Foreign Application Priority Data
Dec. 7, 2011 (JP) ................................. 2011-267970

(51) Int. Cl.
| B41L 13/00 | (2006.01) |
| B41L 13/02 | (2006.01) |
| B41F 15/36 | (2006.01) |
| H05K 3/12 | (2006.01) |
| B41F 15/08 | (2006.01) |
| H05K 3/34 | (2006.01) |

(52) U.S. Cl.
CPC .............. *B41F 15/36* (2013.01); *H05K 3/3484* (2013.01); *H05K 3/1225* (2013.01); *B41F 15/08* (2013.01)

USPC ...................... 101/127.1; 101/126; 101/128.1

(58) Field of Classification Search
USPC .............. 101/114, 123, 124, 126, 127, 127.1, 101/128.1
See application file for complete search history.

(56) References Cited

U.S. PATENT DOCUMENTS

| 3,943,851 A | 3/1976 | Inada et al. |
| 4,084,505 A * | 4/1978 | Ichinose ........................ 101/123 |
| 4,254,707 A * | 3/1981 | Lambert et al. ............... 101/123 |
| 5,189,951 A * | 3/1993 | Webster et al. ............ 101/128.1 |
| 6,874,413 B2 * | 4/2005 | Goetz ........................ 101/127.1 |

FOREIGN PATENT DOCUMENTS

| JP | 57-25388 A | 5/1982 |
| JP | 10-157068 A | 6/1998 |
| JP | 2011-189670 A | 9/2011 |

OTHER PUBLICATIONS

International Search Report for PCT/JP20121005766 dated Oct. 16, 2012.

* cited by examiner

*Primary Examiner* — Leslie J Evanisko
*Assistant Examiner* — Marissa Ferguson Samreth
(74) *Attorney, Agent, or Firm* — Pearne & Gordon LLP

(57) ABSTRACT

There are provided an operating knob 42 capable of movement operation in a front-back direction with respect to a right and left side support part 31, a rod member 45 whose front end is joined to the operating knob 42, a back edge stopper 47 which is moved in the front-back direction through the rod member 45 and also is abutted on the back edge of the mask 15 by fixing operation of the rod member 45 by the operating knob 42, and a front edge stopper 53 abutted on the front edge of the mask 15.

2 Claims, 13 Drawing Sheets

(a)

(b)

(a)

(b)

MASK HOLDER

TECHNICAL FIELD

The present invention relates to a mask holder for holding a mask brought into contact with a substrate in a screen printing machine for sliding a squeegee on the mask and printing paste such as solder on the substrate.

BACKGROUND ART

A screen printing machine is an apparatus for printing paste such as solder on an electrode on a substrate held in a substrate holding part, and is configured so that a mask in which a pattern hole according to arrangement of the electrode of the substrate is formed is brought into contact with the substrate so as to vertically match the electrode with the pattern hole and then a squeegee is slid on the mask supplied with the paste and the paste is scraped and is transferred to the electrode of the substrate through the pattern hole of the mask.

In such a screen printing machine, the mask is held in a horizontal attitude by a mask holder formed over the substrate holding part. The mask holder is configured to have right and left side support parts for supporting both right and left sides of the mask when viewed from an operator, a back edge stopper which is provided on the back of the right and left side support parts and is abutted on the back edge of the mask whose both right and left sides are supported by the right and left side support parts, and a front edge stopper which is provided on the front of the right and left side support parts and is abutted on the front edge of the mask (for example, Patent Reference 1).

Since it is necessary to change the mask according to a kind etc. of the substrate targeted for screen printing, the right and left side support parts of the mask holder are configured so that a distance between a pair of rail-shaped members for supporting both right and left sides of the mask can be changed according to a dimension in a right-and-left direction of the mask, and a position in a front-back direction of the front edge stopper can also be changed according to dimensions of the mask. Also, some mask holders can change a position in a front-back direction of the back edge stopper.

PRIOR ART REFERENCE

Patent Reference

Patent Reference 1: JP-A-2011-189670

DISCLOSURE OF THE INVENTION

Problems that the Invention is to Solve

However, since the conventional mask holder is configured to respectively screw the back edge stopper and the front edge stopper into the right and left side support parts, when a position of the back edge stopper is changed, it is necessary for an operator to move to the back side of the screen printing machine and detach and attach the back edge stopper from and to the right and left side support parts, and a normal work position must be left and further a component (for example, the back edge stopper itself or an attachment screw of the back edge stopper) may be dropped or lost, so that there is a problem that installation work of the mask cannot be done easily.

Hence, an object of the invention is to provide a mask holder capable of easily doing installation work of a mask.

Means for Solving the Problems

A mask holder of the invention is the mask holder for holding a mask brought into contact with a substrate in a screen printing machine, and includes right and left side support parts for supporting both right and left sides of the mask horizontally inserted from the front, an operating member capable of movement operation in a front-back direction with respect to the right and left side support part, a rod member whose front end is joined to the operating member, the rod member formed so as to extend in the front-back direction along a lateral part of the right and left side support part, a back edge stopper which is joined to a back end of the rod member and is moved in the front-back direction through the rod member by movement operation in the front-back direction with respect to the right and left side support part by the operating member and also is fixed to the right and left side support part by fixing operation of the rod member to the right and left side support part by the operating member and is abutted on a back edge of the mask whose both right and left sides are supported by the right and left side support parts, and a front edge stopper abutted on a front edge of the mask whose both right and left sides are supported by the right and left side support parts.

The mask holder of the invention is the mask holder described above, and the front edge stopper is slidable on a shaft member provided on the right and left side support part so as to extend in the front-back direction, and is configured so as to be able to retract in a position in which the front edge stopper does not interfere with a mask by swinging the front edge stopper with respect to the shaft member at the time of inserting and withdrawing the mask into and from the right and left side support parts.

Advantage of the Invention

In the invention, the back edge stopper is joined to the back end of the rod member operated by the operating member capable of movement operation in the front-back direction with respect to the right and left side support part, and movement of the back edge stopper in the front-back direction and fixing of the back edge stopper to the right and left side support part can be performed from the lateral part of the mask holder (further, the front of the mask holder), so that it is unnecessary for an operator to leave a normal work position and move to the back side of the screen printing machine in order to change a position of the back edge stopper, and there is no fear of losing a component (for example, the back edge stopper itself or an attachment screw of the back edge stopper), so that installation work of the mask can be done easily.

Also, the front edge stopper is slidable on the shaft member provided on the right and left side support part so as to extend in the front-back direction, and is configured so as to be able to retract in the position in which the front edge stopper does not interfere with the mask by swinging the front edge stopper with respect to the shaft member at the time of inserting and withdrawing the mask into and from the right and left side support parts, so that work of abutting the front edge stopper on the front edge of the mask can be done by operation of sliding of the front edge stopper on the shaft member and operation of swinging of the front edge stopper around the shaft member. As a result, there is no fear of losing a component (for example, the front edge stopper itself or an attachment screw of the front edge stopper) and also in this respect, installation work of the mask can be done easily.

MODE FOR CARRYING OUT THE INVENTIONS

Figure 1:
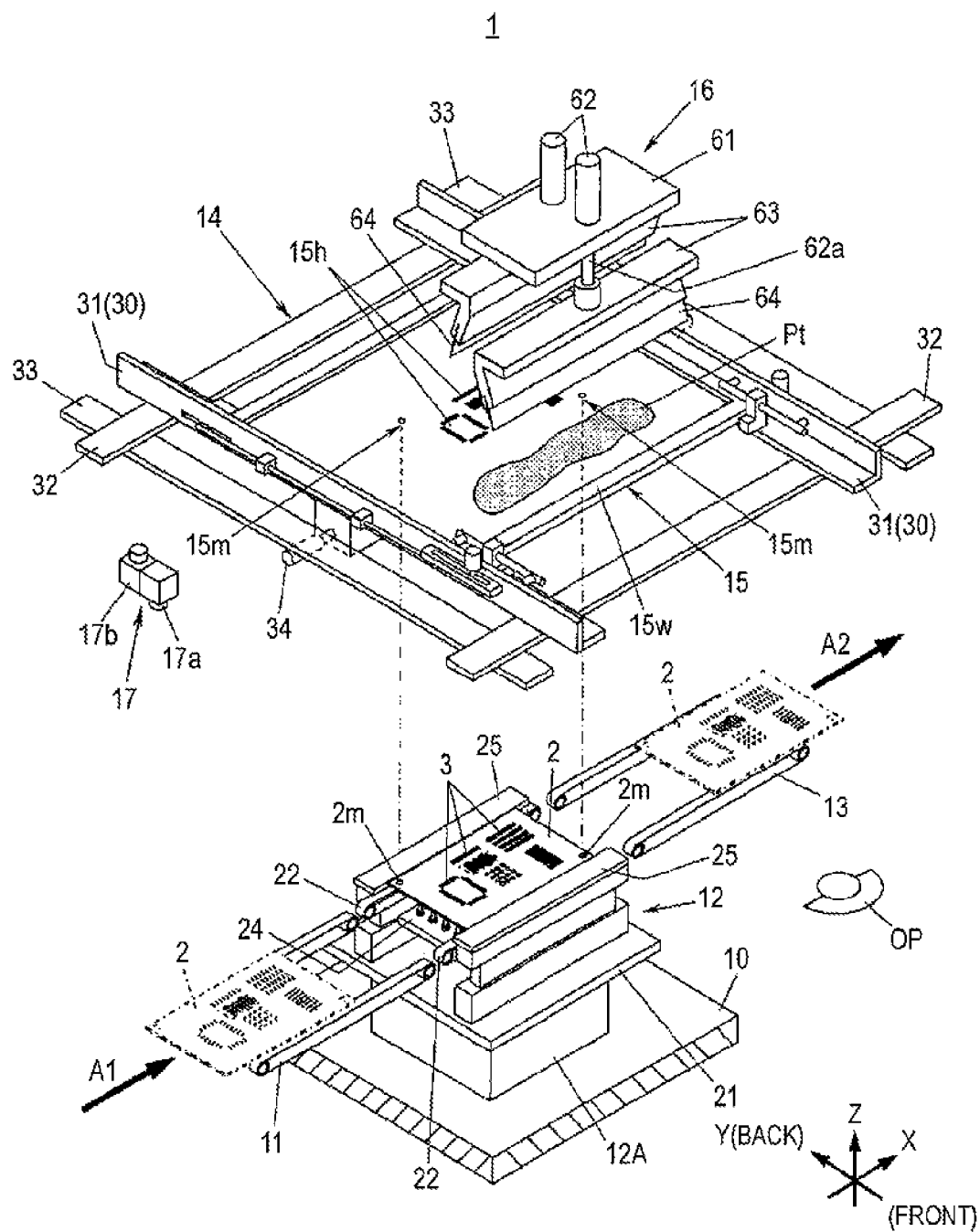
FIG. 1 is a perspective view of a main part of a screen printing machine in one embodiment of the invention.
Figure 2:
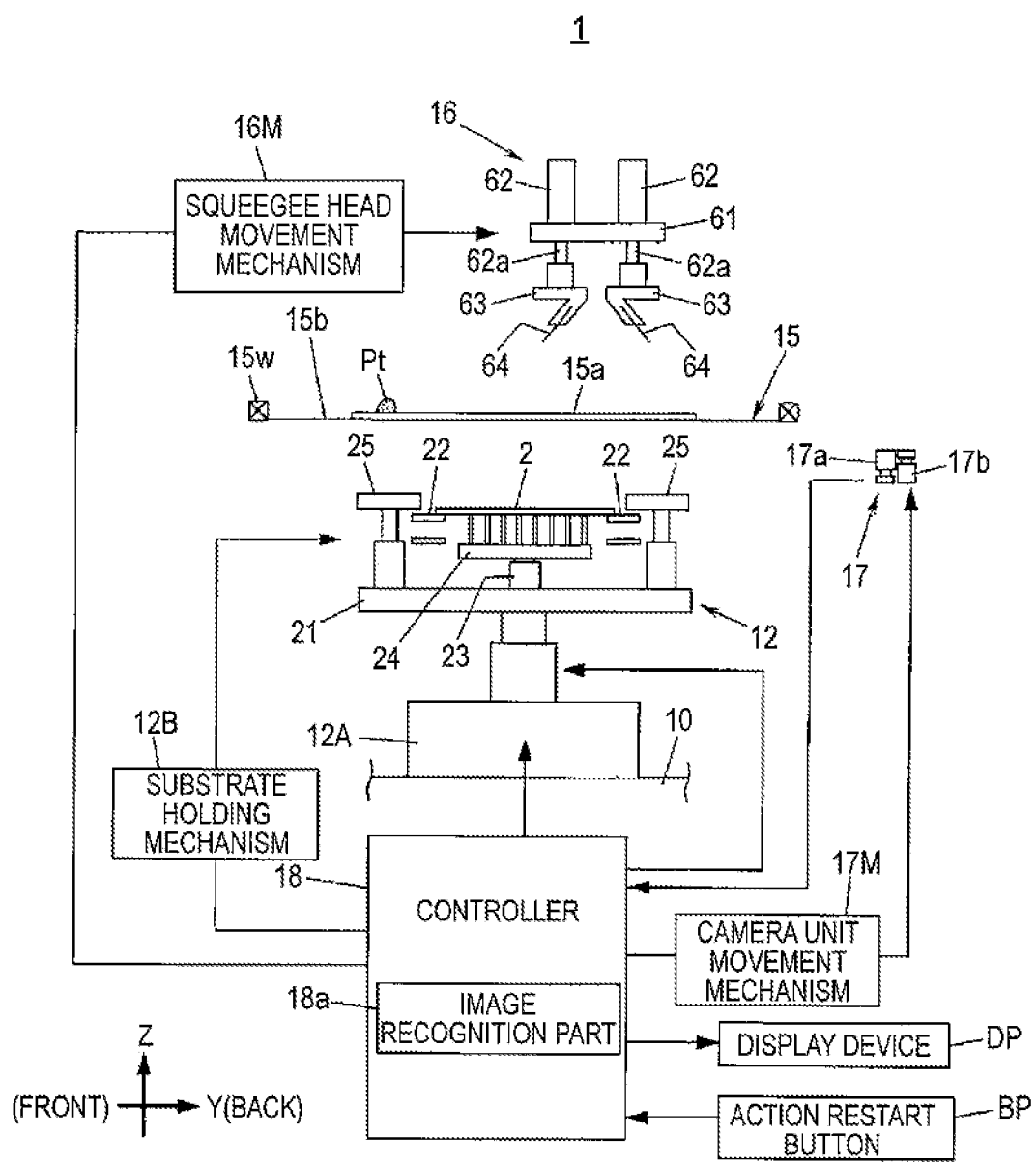
FIG. 2 is a side view of the screen printing machine in one embodiment of the invention.

An embodiment of the invention will hereinafter be described with reference to the drawings. In FIGS. 1 and 2, a screen printing machine 1 is an apparatus for doing screen printing work for screen-printing paste Pt such as solder on each of many electrodes 3 provided on a substrate 2, and includes a substrate carry-in conveyor 11, a substrate holding unit 12 and a substrate carry-out conveyor 13 formed over a base 10, a mask holder 14 formed over the substrate holding unit 12, a mask 15 held in a horizontal attitude by the mask holder 14, a squeegee head 16 formed over the mask 15, a camera unit 17 formed under the mask 15, and a controller 18 which is formed into the base 10 and performs actuation control of each part.

The substrate carry-in conveyor 11 carries in the substrate 2 injected from the outside of the screen printing machine 1 (arrow A1 shown in FIG. 1), and passes the substrate 2 to the substrate holding unit 12. The substrate carry-out conveyor 13 carries the substrate 2 received from the substrate holding unit 12 to the outside of the screen printing machine 1 (arrow A2 shown in FIG. 1). That is, the substrate 2 is carried in order of the substrate carry-in conveyor 11, the substrate holding unit 12 and the substrate carry-out conveyor 13, and a movement direction of this substrate 2 is set in an X-axis direction (a right-and-left direction viewed from an operator OP). Also, a direction in a horizontal plane orthogonal to this X-axis direction is set in a Y-axis direction (a front-back direction viewed from the operator OP), and a vertical direction is set in a Z-axis direction.

The substrate holding unit 12 includes a unit base 21 capable of movement in the Z-axis direction and movement (also including rotation) in an XY plane by a unit movement mechanism 12A made of an XYZ robot, a pair of conveyors 22 which is attached to the unit base 21 and carries the substrate 2 in the X-axis direction and positions the substrate 2 in a predetermined work position (position shown in FIG. 1), a downward receiving part up-and-down cylinder 23 provided on the unit base 21, a downward receiving part 24 which is moved up and down by the downward receiving part up-and-down cylinder 23 and lifts and supports the substrate 2 from the downward side so that both ends of the substrate 2 positioned in the work position by the conveyors 22 are upwardly separated from the conveyors 22, and a pair of clamp members 25 which is formed openably and closably in the Y-axis direction and holds the substrate 2 by pinching (clamping) both lateral parts of the substrate 2 lifted and supported by the downward receiving part 24 from the Y-axis direction.

Figure 3:
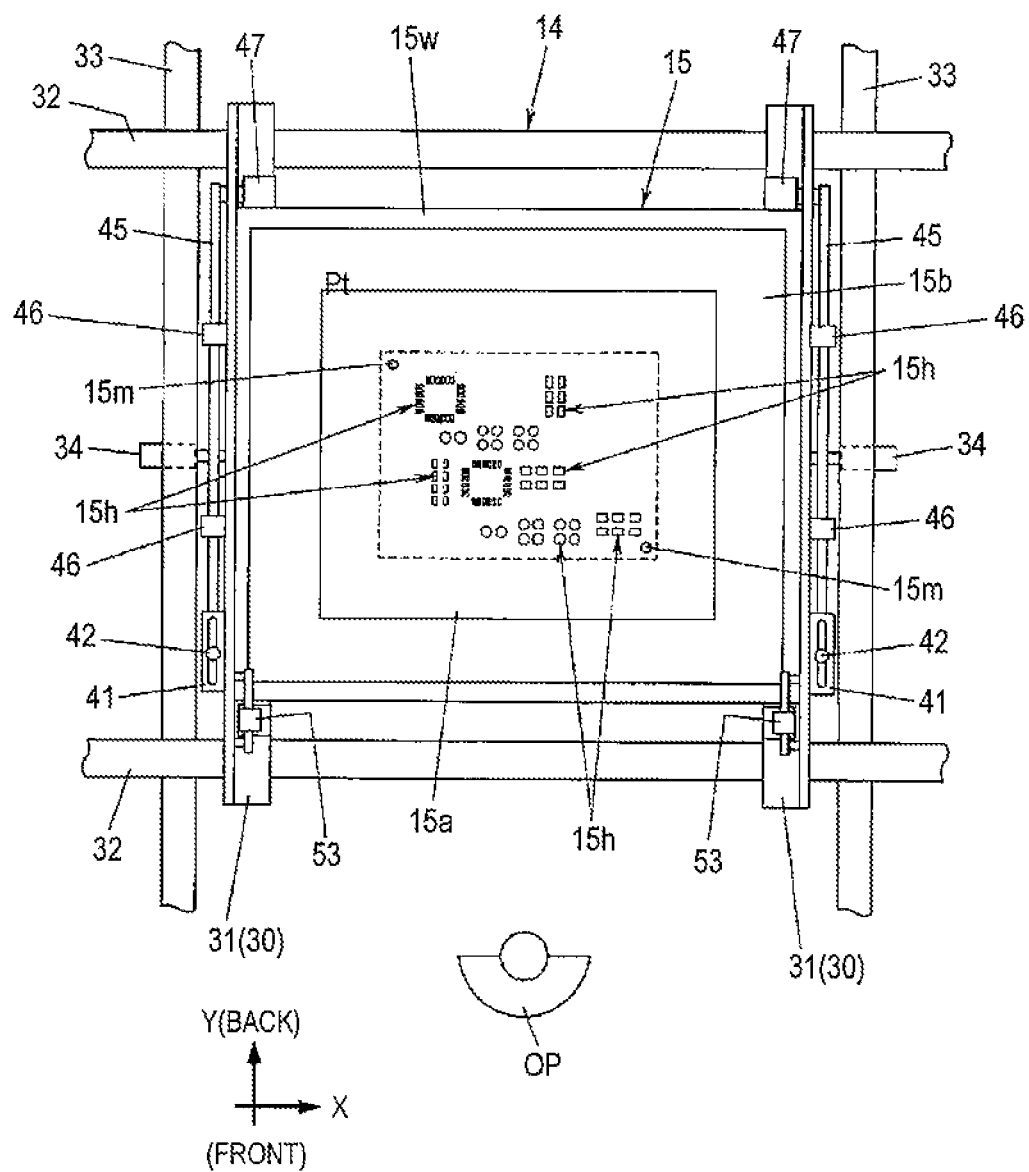
FIG. 3 is a plan view of a mask holder included by the screen printing machine in one embodiment of the invention and a mask installed in the mask holder.

In FIG. 3, the mask 15 includes a mask body 15a made of a rectangular metal plate having many pattern holes 15h formed according to arrangement of the electrodes 3 on the substrate 2, a mesh-shaped film member 15b made of resin (for example, polyester) formed around the mask body 15a, and a mask frame 15w with a rectangular frame shape for supporting the outer periphery of the film member 15b.

Figure 4:
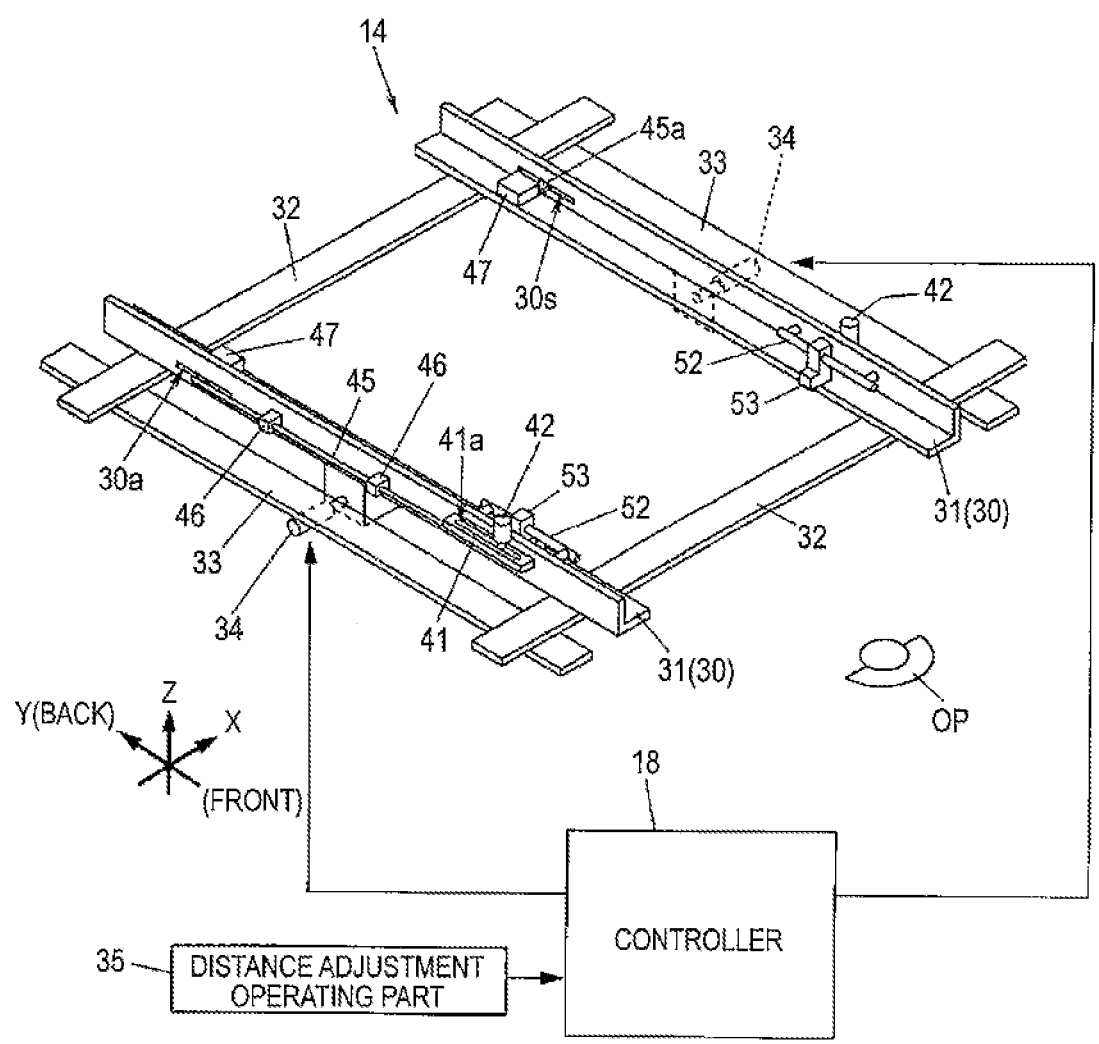
FIG. 4 is a perspective view of the mask holder included by the screen printing machine in one embodiment of the invention.

In FIGS. 3 and 4, the mask holder 14 includes right and left side support parts 31 made of a pair of right and left rail-shaped members 30 with an L-shaped cross section which extends in the Y-axis direction and supports both right and left sides of the mask 15 opposed in the X-axis direction from the downward side, and a pair of front and back guide members 32 which extends in the X-axis direction and respectively supports the right and left rail-shaped members 30 movably in the X-axis direction. The front and back guide members 32 are fixed to the base 10 by a pair of right and left beam members 33 which extends in the Y-axis direction and is formed oppositely in the X-axis direction.

In FIGS. 3 and 4, the right and left beam members 33 are respectively provided with rail-shaped member driving cylinders 34. A piston rod of each of the rail-shaped member driving cylinders 34 extending in the X-axis direction is joined to the rail-shaped member 30, and when the piston rods of the two rail-shaped member driving cylinders 34 advance and retract in synchronization, the right and left, rail-shaped members 30 move along the front and back guide members 32 (that is, in the X-axis direction) mutually in the opposite direction.

As shown in FIG. 4, a distance adjustment operating part 35 operated by the operator OP is connected to the controller 18, and the controller 18 controls the amounts of actuation of the right and left rail-shaped member driving cylinders 34 according to the amount of operation of the distance adjustment operating part 35. As a result, the operator OP can adjust a distance between the right and left rail-shaped members 30 in the X-axis direction by adjusting the amount of operation of the distance adjustment operating part 35.

Figure 5:
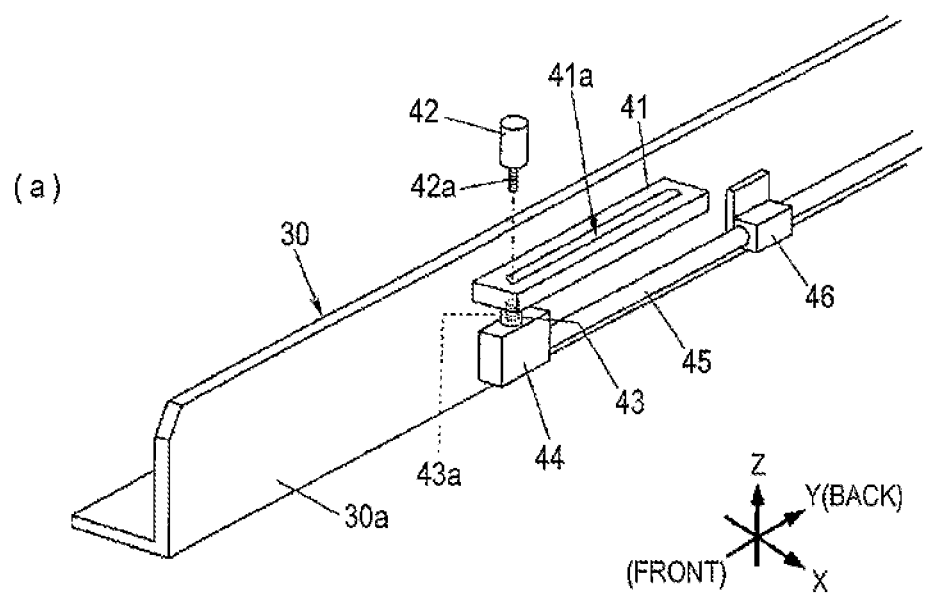
FIG. 5 is view in which (a) and (b) are partially enlarged perspective views of the mask holder in one embodiment of the invention.
Figure 5:
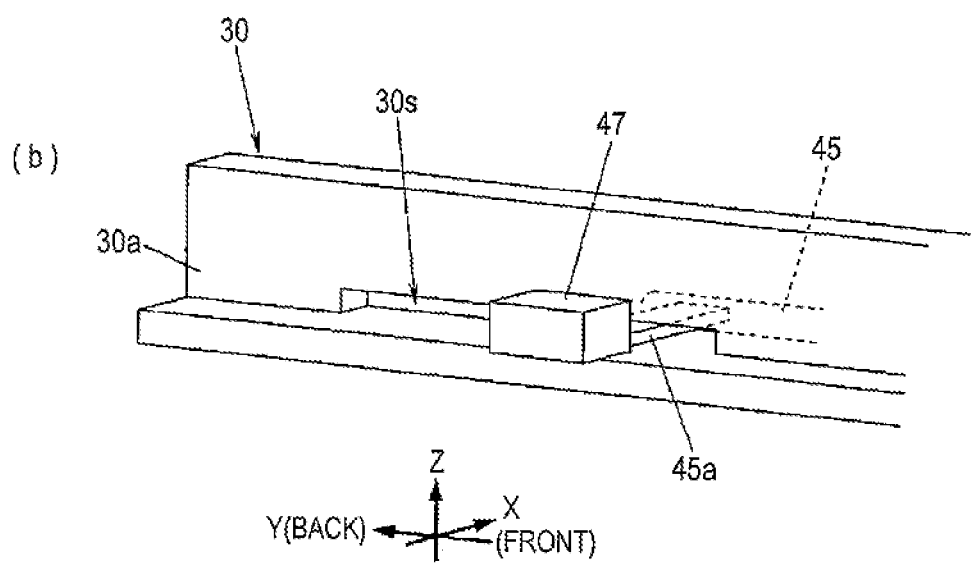

As shown in FIG. 4 and (a) in FIG. 5, a forward position of an outside surface of a vertical part 30a of each of the rail-shaped members 30 constructing the right and left side support parts 31 of the mask holder 14 is provided with a table 41 for operation extending in the front-back direction. The table 41 for operation is provided with a movement groove 41a pierced vertically (in a thickness direction) and having an elongated hole shape extending in the front-back direction, and an operating knob 42 is positioned over the table 41 for operation, and a joining bar 43 extending in the vertical direction is positioned under the table 41 for operation.

In (a) in FIG. 5, the operating knob 42 has a male screw part 42a extending downwardly, and the male screw part 42a is screwed into a female screw part 43a of the upper end of the joining bar 43 from the upward side. An outside diameter of the male screw part 42a of the operating knob 42 is smaller than a groove width of the movement groove 41a, but an outside diameter of the operating knob 42 and an outside diameter of the joining bar 43 become larger than the groove width of the movement groove 41a, and the operating knob 42 is turned around the vertical axis and the male screw part 42a is inserted into the female screw part 43a of the joining bar 43 and thereby, the table 41 for operation can be pinched by the operating knob 42 and the joining bar 43 to fix the joining bar 43 to the table 41 for operation.

In (a) in FIG. 5, the front end of a rod member 45 is attached to the lower end of the joining bar 43 through a joining block 44. The rod member 45 extends in the front-back direction along an outer lateral part of the rail-shaped member 30, and is supported by plural rod member supports 46 provided on an outside surface of the rail-shaped member 30, and is configured movably in the front-back direction (a shaft direction of the rod member 45).

As shown in FIG. 4 and (b) in FIG. 5, the back end of the vertical part 30a of the rail-shaped member 30 is provided with a slit 30s extending in the front-back direction. The back end of the rod member 45 is provided with a projecting piece 45a extending so as to extend through the slit 30s in the X-axis direction, and a block-shaped back edge stopper 47 is attached to the end of this projecting piece 45a (also see FIG. 4). As a result, the operator OP moves the operating knob 42 along the movement groove 41a backward and forward and thereby, the back edge stopper 47 can be moved in the front-back direction through the joining block 44 and the rod member 45 and also, the back edge stopper 47 can be fixed to the rail-shaped member 30 in any position of the Y-axis direction by performing fixing operation (fixing operation of the rod member 45 to the right and left side support part 31 by the operating knob 42) of fixing the joining bar 43 to the table 41 for operation by turning the operating knob 42 around the vertical axis.

Figure 6:
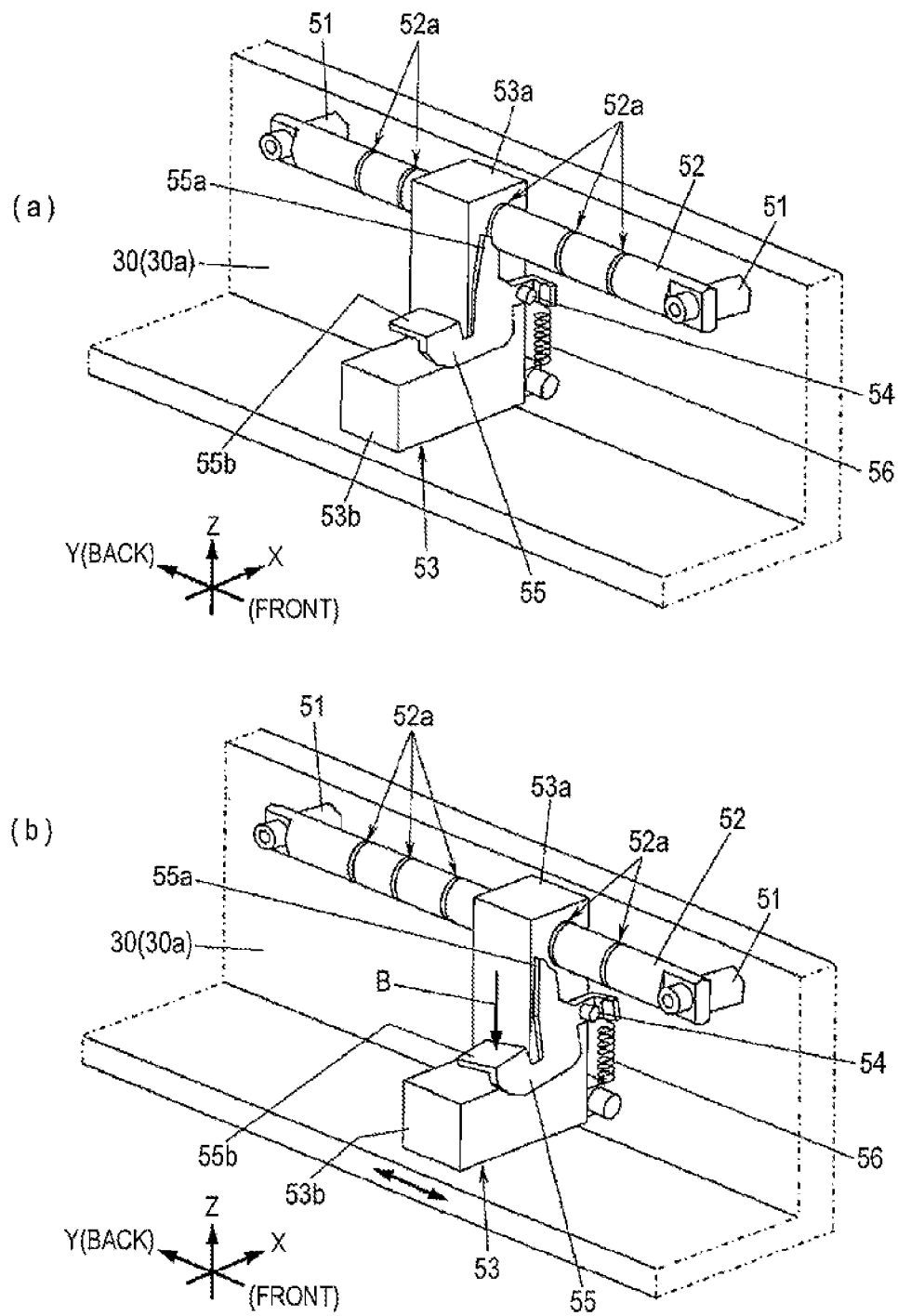
FIG. 6 is view in which (a) and (b) are partially enlarged perspective views of the mask holder in one embodiment of the invention.

As shown in (a) and (b) in FIG. 6, a front position of an inside surface of the vertical part 30a of each of the rail-shaped members 30 is provided with a pair of front and back projecting parts 51 extending so as to horizontally project from the inside surface of the vertical part 30a, and the front and back ends of a shaft member 52 extending in the front-back direction are supported in the pair of projecting parts 51.

A front edge stopper 53 which has a vertical part 53a through which the shaft member 52 extends in the front-back direction and a horizontal part 53b overhanging from the lower end of the vertical part 53a to the inside (the side toward the other rail-shaped member 30 opposed in the X-axis direction) of the mask holder 14 and is formed in a generally L shape is attached to the shaft member 52. This front edge stopper 53 is swingable around the Y axis using the shaft member 52 as a rotary shaft and also is slidable along the shaft member 52 in the Y-axis direction.

In (a) and (b) in FIG. 6, a lock member 55 swingable around the V axis about a swing pin 54 is attached to the vertical part 53a of the front edge stopper 53, and discrete positions along the shaft member 52 are provided with plural locking grooves 52a formed around a surface of the shaft member 52. The lock member 55 is swingable between a locked position ((a) in FIG. 6) in which a locking part 55a of the upper end of the lock member 55 is selectively locked in one of the plural locking grooves 52a on the shaft member 52 to regulate slide movement of the front edge stopper 53 to the shaft member 52 in the Y-axis direction and an unlocked position ((b) in FIG. 6) in which the locking part 55a is unlocked from the locking groove 52a to permit the slide movement of the front edge stopper 53 to the shaft member 52 in the Y-axis direction. A tension spring 56 is bridged between the lock member 55 and the horizontal part 53b of the front edge stopper 53, and the lock member 55 is always urged to the locked position side by an urging force (tensile force) of the tension spring 56, but the operator OP downwardly presses a lever piece 55b provided on the lock member 55 (arrow B shown in (b) in FIG. 6) and thereby, the lock member 55 can be swung about the swing pin 54 against the urging force of the tension spring 56 to be positioned in the unlocked position in which the locking part 55a is unlocked from the locking groove 52a.

Figure 7:
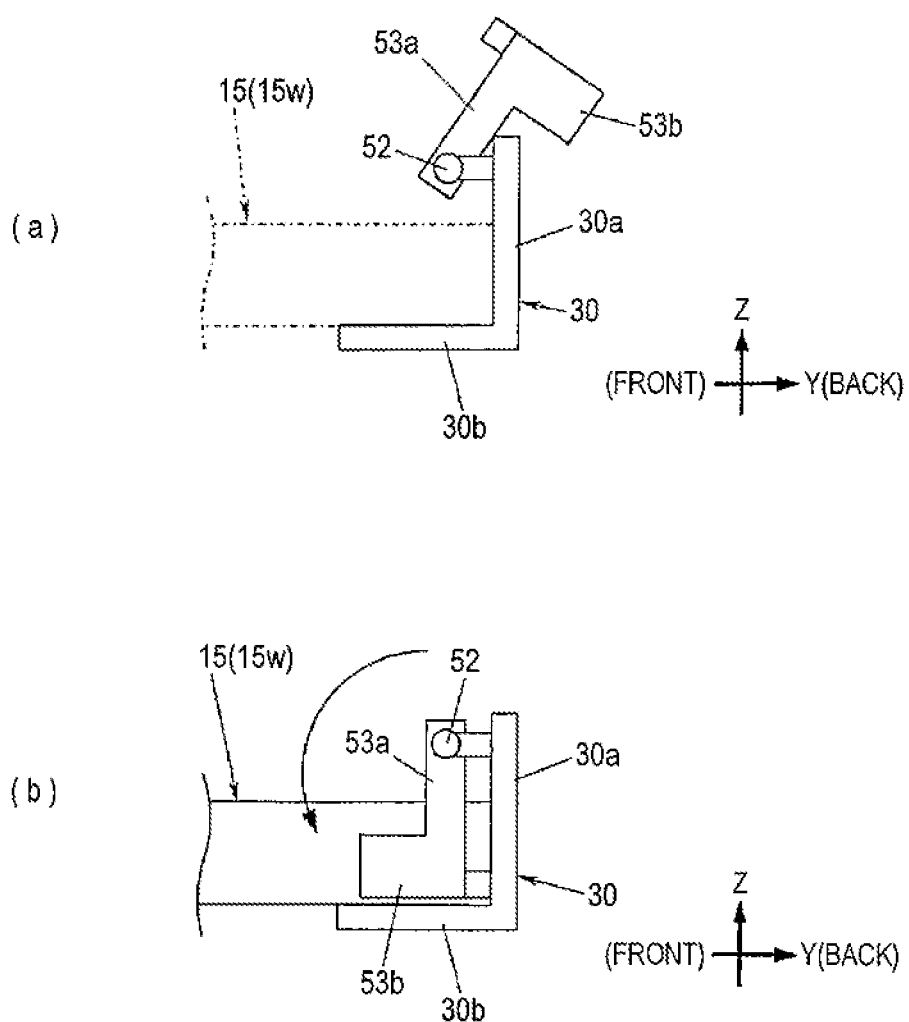
FIG. 7 is view in which (a) and (b) are partially enlarged front views of the mask holder in one embodiment of the invention.

The front edge stopper 53 is swingable around the shaft member 52 between a retracting position ((a) in FIG. 7) in which the horizontal part 53b is positioned upwardly beyond the shaft member 52 and the front edge stopper 53 does not interfere with the mask 15 at the time of inserting and withdrawing the mask 15 into and from the right and left side support parts 31 and an abuttable position (consequently, the front edge stopper 53 may abut on the front end of the mask 15 whose right and left sides are supported by the right and left side support parts 31) ((b) in FIG. 7) in which the horizontal part 53b is positioned downwardly beyond the shaft member 52 and the front edge stopper 53 interferes with the mask 15 at the time of inserting and withdrawing the mask 15 into and from the right and left side support parts 31.

Figure 8:
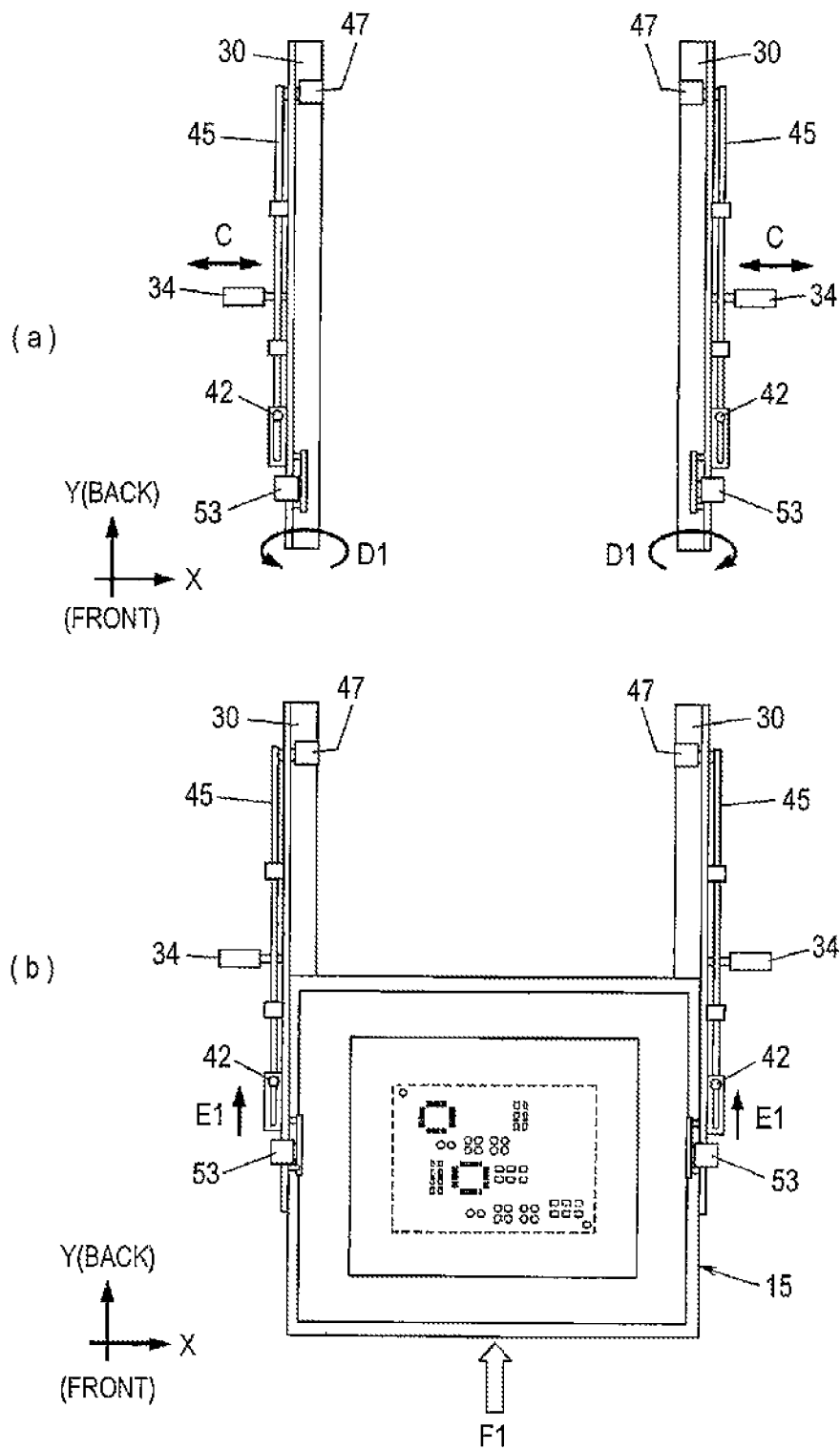
FIG. 8 is view in which (a) and (b) are diagrams showing a procedure for installing the mask in the mask holder in one embodiment of the invention.

When the mask 15 is held in the mask holder 14 configured this, the operator OP first performs operation of the distance adjustment operating part 35 and adjusts a distance between the right and left side support parts 31 (the right and left rail-shaped members 30) so as to match with a dimension of the mask 15 in the right-and-left direction (arrow C shown in (a) in FIG. 8), and respectively swings the right and left front edge stoppers 53 around the shaft members 52 to position the front edge stoppers 53 in the retracting positions (arrow D1 shown in (a) in FIG. 8). Then, the right and left operating knobs 42 are moved in the front-back direction (arrow E1 shown in (b) in FIG. 8) and the right and left back edge stoppers 47 are positioned in the backmost positions (positions in which the back ends of the projecting pieces 45a abut on the back ends of the slits 30s) and thereafter, the mask 15 is inserted from the front of the mask holder 14 so that lower surfaces of both right and left edges of the mask 15 are supported by horizontal parts 30b of the right and left rail-shaped members 30 from the bottom (arrow F1 shown in (b) in FIG. 8).

Figure 9:
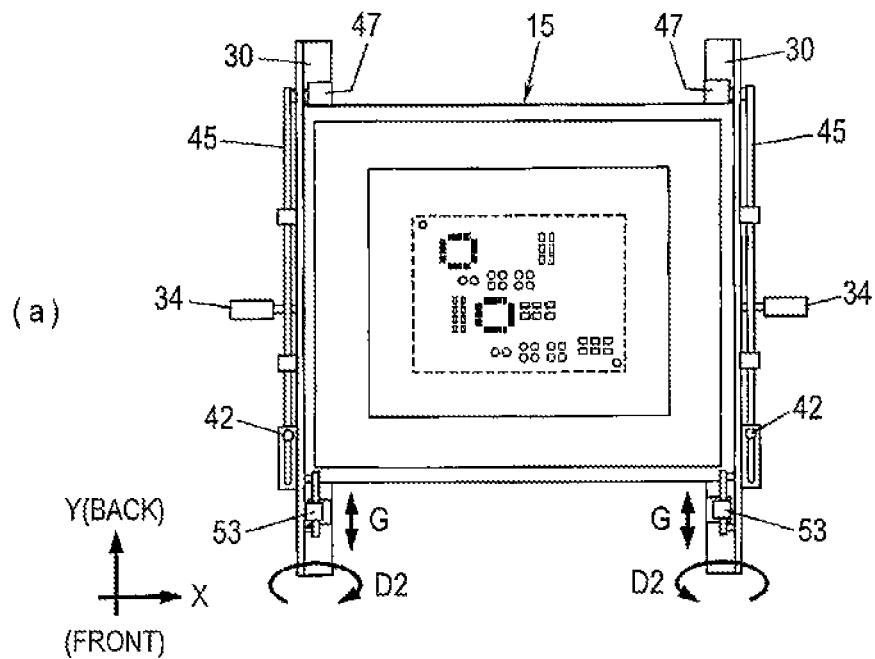
FIG. 9 is view in which (a) and (b) are diagrams showing a procedure for installing the mask in the mask holder in one embodiment of the invention.
Figure 9:
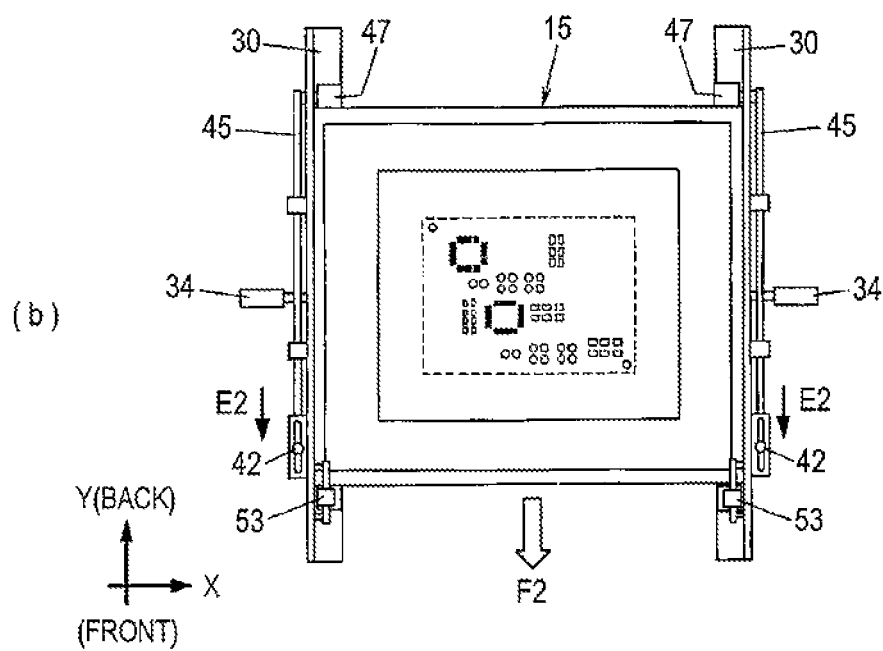

Accordingly, when the back edge of the mask 15 abuts on the right and left back edge stoppers 47, the right and left front edge stoppers 53 are unlocked from the shaft members 52 and thereafter, the right and left front edge stoppers 53 are respectively slid along the shaft members 52 in the front-back direction (arrow G shown in (a) in FIG. 9) and are positioned in a position suitable for a dimension of the mask 15 in the front-back direction and the front edge stoppers 53 are locked in the shaft members 52 by the lock members 55 and thereafter, the right and left front edge stoppers 53 are respectively swung around the shaft members 52 to be positioned in the abuttable positions (arrow D2 shown in (a) in FIG. 9). Then, by simultaneously pulling the right and left operating knobs 42 forwardly (arrow E2 shown in (b) in FIG. 9), the whole mask 15 is moved forwardly (arrow F2 shown in (b) in FIG. 9) and the front edge of the mask 15 is abutted on the right and left front edge stoppers 53 from the back and thereafter, the right and left operating knobs 42 are turned to perform fixing operation of the right and left rod members 45. Accordingly, the mask 15 is held by the mask holder 14, and installation of the mask 15 in the mask holder 14 is completed.

In FIGS. 1 and 2, the squeegee head 16 includes a plate-shaped base member 61 formed movably in the Y-axis direction in an upward region of the mask 15 held in the mask holder 14, two squeegee up-and-down cylinders 62 which are attached to the base member 61 and project piston rods 62a to the downward side of the base member 61, squeegee retainers 63 which are attached to the lower ends of the piston rods 62a of each of the squeegee up-and-down cylinders 62 and extend in the X-axis direction, and two squeegees 64 whose upper ends are held in each of the squeegee retainers 63, the squeegees 64 made of thin-plate members extending to the oblique downward side.

In FIGS. 1 and 2, the camera unit 17 includes a downward imaging camera 17a whose visual field is turned downwardly, and an upward imaging camera 17b whose visual field is turned upwardly. The camera unit 17 is moved in a direction in a horizontal plane in a downward region of the mask 15 by a camera unit movement mechanism 17M including an actuator (not shown) etc.

The controller 18 performs actuation control of a substrate holding mechanism 12B (FIG. 2) including actuators etc. including the downward receiving part up-and-down cylinder 23 and thereby, a positioning action of the substrate 2 in carrying and work positions by the conveyors 22 of the substrate holding unit 12, a downward receiving action by the downward receiving part 24 with respect to the substrate 2 positioned in the work position, and a clamping action by a pair of clamp members 25 are performed, and the controller 18 performs actuation control of the unit movement mechanism 12A described above and thereby, a movement action of the substrate holding unit 12 holding the substrate 2 in the vertical direction and the direction in the horizontal plane is performed. Also, a carry-in action of the substrate 2 by the substrate carry-in conveyor 11 and a carry-out action of the substrate 2 by the substrate carry-out conveyor 13 are performed by the controller 18.

In FIG. 2, the controller 18 performs actuation control of a squeegee head movement mechanism 16M including an actuator (not shown) etc. and thereby, a reciprocation action of the squeegee head 16 (base member 61) in the Y-axis direction is performed, and the controller 18 performs actuation control of the squeegee up-and-down cylinder 62 corresponding to the squeegee 64 and moves up and down the squeegee retainer 63 and thereby, an up-and-down action of each of the squeegees 64 with respect to the base member 61 is performed.

In FIG. 2, the controller 18 performs actuation control of the camera unit movement mechanism 17M and thereby, a movement action of the camera unit 17 in the horizontal plane is performed. An imaging action by the downward imaging camera 17a and an imaging action by the upward imaging camera 17b are respectively controlled by the controller 18, and image data obtained by the imaging action of the downward imaging camera 17a and image data obtained by the imaging action of the upward imaging camera 17b are respectively sent to the controller 18, and image recognition processing is performed in an image recognition part 18a of the controller 18.

Figure 10:
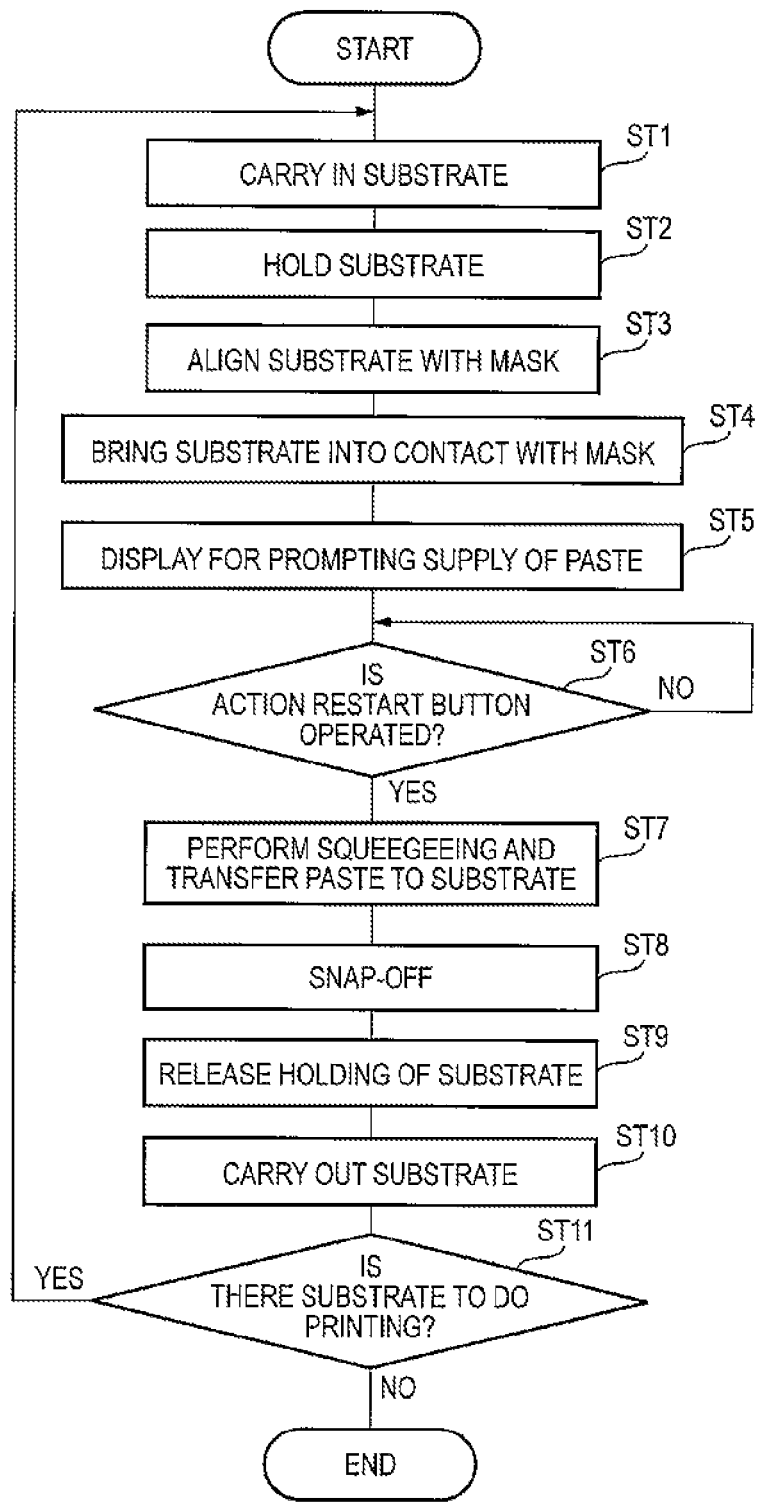
FIG. 10 is a flowchart showing a procedure of screen printing work executed by the screen printing machine in one embodiment of the invention.
Figure 11:
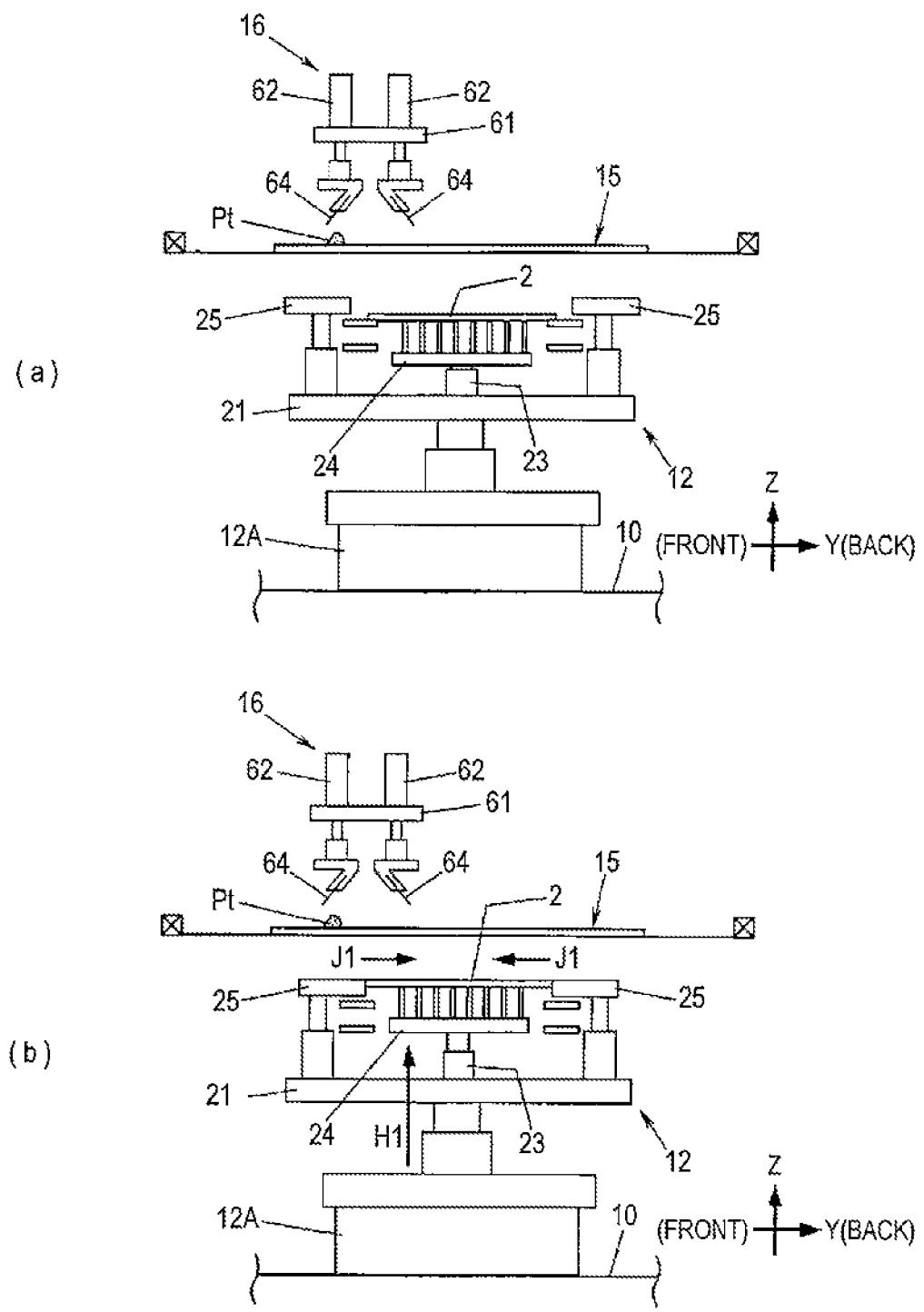
FIG. 11 is diagram in which (a) and (b) are diagrams showing an execution procedure of screen printing work by the screen printing machine in one embodiment of the invention.

When the screen printing machine 1 configured thus does screen printing work, the controller 18 first actuates the substrate carry-in conveyor 11 and the conveyors 22 of the substrate holding unit 12 after detecting that the substrate 2 is fed from other device of the upstream process side, and carries the substrate 2 in the screen printing machine 1 ((a) in FIG. 11, step ST1 shown in FIG. 10), and thereafter performs actuation control of the substrate holding mechanism 12B and holds the substrate 2 ((b) in FIG. 11, step ST2 shown in FIG. 10). Concretely, the substrate 2 is held by driving a pair of clamp members 25 in a closed direction and pinching both ends of the substrate 2 (arrow J1 shown in (b) in FIG. 11) while pushing up the downward receiving part 24 by the downward receiving part up-and-down cylinder 23 and lifting the substrate 2 in a state floating from the conveyors 22 (arrow H1 shown in (b) in FIG. 11).

After the substrate 2 is held, the controller 18 performs actuation control of the camera unit movement mechanism 17M, and while the downward imaging camera 17a is positioned just over a substrate side mark 2m (FIG. 1) formed in the substrate 2 and the substrate side mark 2m is imaged by the downward imaging camera 17a, the upward imaging camera 17b is positioned just under a mask side mark 15m (FIGS. 1 and 3) formed in the mask 15 and the mask side mark 15m is imaged by the upward imaging camera 17b. Then, a position of the substrate 2 is grasped from image data of the substrate side mark 2m obtained and also, a position of the mask 15 is grasped from image data of the mask side mark 15m obtained, and the substrate holding unit 12 is moved in the direction in the horizontal plane, and the substrate 2 is aligned with the mask 15 in the direction in the horizontal plane so as to vertically oppose the substrate side mark 2m to the mask side mark 15m (step ST3 shown in FIG. 10).

Figure 12:
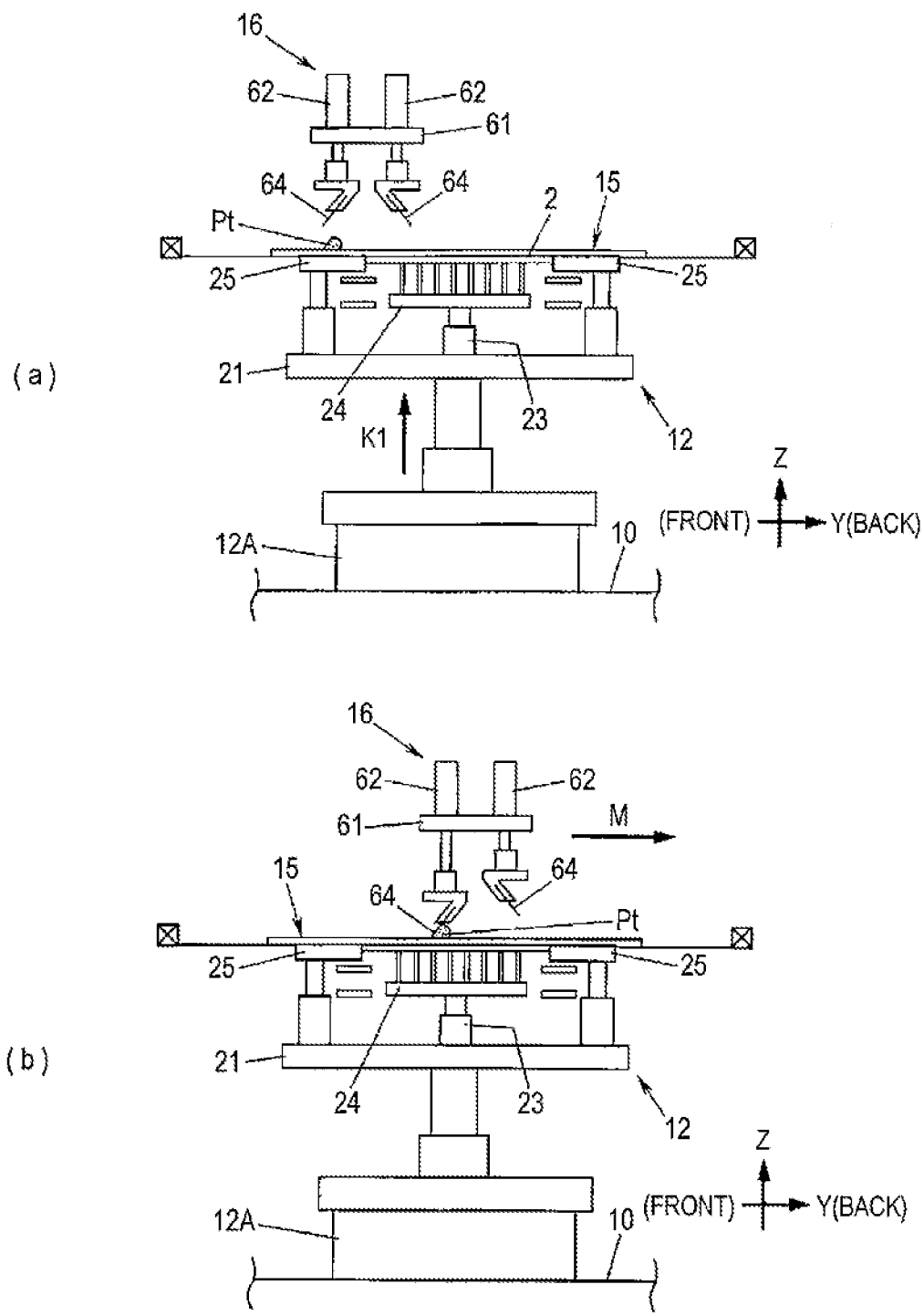
FIG. 12 is diagram in which (a) and (b) are diagrams showing an execution procedure of screen printing work by the screen printing machine in one embodiment of the invention.

After alignment between the substrate 2 and the mask 15 is completed, the controller 18 performs actuation control of the unit movement mechanism 12A, and the substrate holding unit 12 is moved up with respect to the base 10 (arrow K1 shown in (a) in FIG. 12), and a pair of clamp members 25 holding the substrate 2 is relatively pressed on a lower surface of the mask 15 from the downward side and thereby, respective upper surfaces of a pair of clamp members 25 and the substrate 2 are brought into contact with the lower surface of the mask 15 ((a) in FIG. 12, step ST4 shown in FIG. 10). Accordingly, the electrodes 3 on the substrate 2 match with the pattern holes 15h of the mask 15.

After the substrate 2 is brought into contact with the mask 15, the controller 18 displays a message for prompting the operator OP to supply paste Pt on a display device DP (FIG. 2) connected to the controller 18 (step ST5 shown in FIG. 10). With respect to this display, the operator OP visually checks the paste Pt remaining on the mask 15 at the present point in time, and decides whether or not to supply (supplement) the paste Pt based on the amount of paste Pt. Then, in the case of deciding that the paste Pt is supplied, the paste Pt is supplied on the mask 15 by a paste supply syringe (not shown) prepared separately. Then, in the case of deciding that supply of the paste Pt is completed or supply of the paste Pt is not required, the operator OP operates an action restart button BT (FIG. 2) connected to the controller 18.

After the message for prompting the operator OP to supply the paste Pt is displayed an the display device OP, the controller 18 decides whether or not the action restart button BT is operated at regular intervals (step ST6 shown in FIG. 10), and in the case of detecting that the operator OP operates the action restart button BT based on a signal output from the action restart button BT, squeegeeing by the squeegee 64 is performed and the paste Pt on the mask 15 is transferred to the substrate 2 (step ST7 shown in FIG. 10).

Concretely, this squeegeeing is performed by moving down one of the two squeegees 64 from the squeegee head 16 and moving the base member 61 in the Y-axis direction while maintaining a state abutting on an upper surface of the mask 15 (arrow M shown in (b) in FIG. 12). Accordingly, the squeegee 64 slides on the mask 15, and the paste Pt on the mask 15 is scraped by the squeegee 64 and is pushed into the pattern holes 15h of the mask 15 and is transferred to the electrodes 3 of the substrate 2. In addition, the controller 18 abuts the squeegee 64 of the back side on the mask 15 when the squeegee head 16 is moved from the front to the back to perform the squeegeeing, and abuts the squeegee 64 of the front side on the mask 15 when the squeegee head 16 is moved from the back to the front to perform the squeegeeing.

Figure 13:
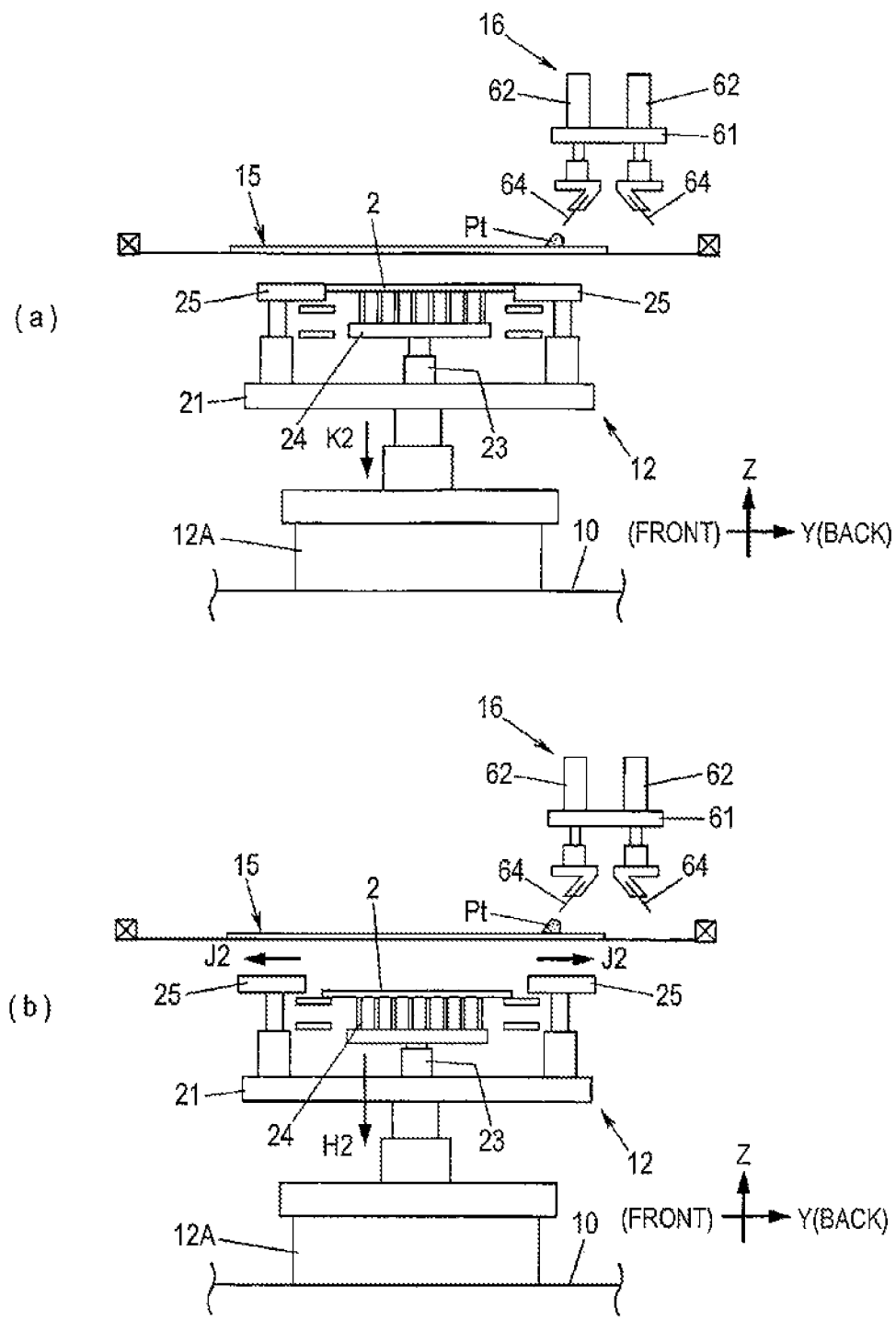
FIG. 13 is diagram in which (a) and (b) are diagrams showing an execution procedure of screen printing work by the screen printing machine in one embodiment of the invention.

After the squeegeeing is performed and the paste Pt is transferred to the substrate 2, the controller 18 actuates the unit movement mechanism 12A and moves down the substrate holding unit 12 (arrow K2 shown in (a) in FIG. 13), and the substrate 2 and a pair of clamp members 25 are separated from the mask 15 to perform a snap-off ((a) in FIG. 13, step ST8 shown in FIG. 10). Accordingly, the paste Pt remains on the electrodes 3 of the substrate 2 and the paste Pt is printed on the substrate 2.

After the snap-off is completed, the controller 18 releases holding of the substrate 2 by the substrate holding unit 12 ((b) in FIG. 13, step ST9 shown in FIG. 10). Concretely, the controller 18 actuates the substrate holding mechanism 12B and opens a pair of clamp members 25 (arrow J2 shown in (b) in FIG. 13) and thereafter moves down the downward receiving part 24 (arrow H2 shown in (b) in FIG. 13) and lowers both ends of the substrate 2 on a pair of conveyors 22 and thereby, this holding of the substrate 2 is released.

After the holding of the substrate 2 is released, the controller 18 actuates the unit movement mechanism 12A and moves the substrate holding unit 12 in the horizontal plane and adjusts a direction of the conveyors 22 and thereafter, actuates the conveyors 22 and the substrate carry-out conveyor 13 and carries the substrate 2 to the outside of the screen printing machine 1 (step ST10 shown in FIG. 10).

After the substrate 2 is carried out, the controller 18 decides whether or not there is the substrate 2 to do screen printing further (step ST11 shown in FIG. 10). As a result, when there is the substrate 2 to do screen printing further, a new substrate 2 is carried in by returning to step ST1, and when there is no substrate 2 to do screen printing further, a series of screen printing work is completed.

In the screen printing machine 1 in the embodiment, screen printing on the substrate 2 is done by the procedure described above, and when a kind etc. of the substrate 2 are changed and dimensions of the mask 15 are changed, in a state in which the front edge stoppers 53 are slid on the shaft members 52 and are separated from the front edge of the mask 15 and also are swung with respect to the shaft members 52 and are positioned in the retracting positions, the mask 15 is pulled to the front of the mask holder 14 and is withdrawn and thereafter, a new mask 15 is installed in the mask holder 14 in the manner described above.

As described above, the mask holder 14 in the embodiment includes the right and left side support parts 31 for supporting both right and left sides of the mask 15 horizontally inserted from the front, the operating knob 42 (the operating member) capable of movement operation in the front-back direction with respect to the right and left side support part 31, the rod member 45 whose front end is joined to the operating knob 42, the rod member 45 formed so as to extend in the front-back direction along a lateral part of the right and left side support part 31, the back edge stopper 47 which is joined to the back end of the rod member 45 and is moved in the front-back direction through the rod member 45 by movement operation in the front-back direction with respect to the right and left side support part 31 by the operating knob 42 and also is fixed to the right and left side support part 31 by fixing operation of the rod member 45 to the right and left side support part 31 by the operating knob 42 and is abutted on the back edge of the mask 15 whose both right and left sides are supported by the right and left side support parts 31, and the front edge stopper 53 abutted on the front edge of the mask 15 whose both right and left sides are supported by the right and left side support parts 31.

In the mask holder 14 in the embodiment, the back edge stopper 47 is joined to the back end of the rod member 45 operated by the operating knob 42 capable of movement operation in the front-back direction with respect to the right and left side support part 31, and movement of the back edge stopper 47 in the front-back direction and fixing of the back edge stopper 47 to the right and left side support part 31 can be performed from the lateral part of the mask holder 14 (further, the front of the mask holder 14). As a result, it is unnecessary for the operator OP to leave a normal work position (a front position of the screen printing machine 1) and move to the back side of the screen printing machine 1 in order to change a position of the back edge stopper 47, and there is no fear of losing a component (for example, the back edge stopper 47 itself or an attachment screw of the back edge stopper 47), so that installation work of the mask 15 can be done easily.

Also, in the mask holder 14 in the embodiment, the front edge stopper 53 is slidable on the shaft member 52 provided on the right and left side support part 31 so as to extend in the front-back direction, and is configured so as to be able to retract in a position in which the front edge stopper does not interfere with the mask 15 by swinging the front edge stopper with respect to the shaft member 52 at the time of inserting and withdrawing the mask 15 into and from the right and left side support parts 31, so that work of abutting the front edge stopper 53 on the front edge of the mask 15 can be done by operation of sliding of the front edge stopper 53 on the shaft member 52 and operation of swinging of the front edge stopper 53 around the shaft member 52. As a result, there is no fear of losing a component (for example, the front edge stopper 53 itself or an attachment screw of the front edge stopper 53) and also in this respect, installation work of the mask 15 can be done easily.

Here, the configuration of fixing of the back edge stopper 47 to the right and left side support part 31 and the configuration of fixing of the front edge stopper 53 to the right and left side support part 31 shown in the example described above are only one example, and other configurations may be adopted. For example, in the example described above, the front edge stopper 53 is configured to be fixed in a discrete position of the Y-axis direction by combinations of the lock member 55 and the locking grooves 52a, but such a configuration is not adopted, and the front edge stopper 53 may be configured to be able to be fixed to the rail-shaped member 30 in any position of the Y-axis direction like the back edge stopper 47 described above. In this case, the back edge stopper 47 is first positioned in the front-back direction and the back edge of the mask 15 is abutted on this back edge stopper 47 and then the front edge stopper 53 positioned in the abuttable position is slid and is abutted on the front edge of the mask 15 and thereafter the front edge stopper 53 is fixed to the right and left side support part 31 and thereby, the mask 15 can be installed in the mask holder 14.

The present application is based on Japanese patent application (patent application No. 2011-267970) filed on Dec. 7, 2011, and the contents of the patent application are hereby incorporated by reference.

INDUSTRIAL APPLICABILITY

A mask holder capable of easily doing installation work of a mask is provided.

DESCRIPTION OF REFERENCE NUMERALS AND SIGNS

1 SCREEN PRINTING MACHINE
2 SUBSTRATE
14 MASK HOLDER
15 MASK
31 RIGHT AND LEFT SIDE SUPPORT PART
42 OPERATING KNOB (OPERATING MEMBER)
45 ROD MEMBER
47 BACK EDGE STOPPER
52 SHAFT MEMBER
53 FRONT EDGE STOPPER

The invention claimed is:

1. A mask holder for holding a mask brought into contact with a substrate in a screen printing machine, comprising:

right and left side support parts supporting both right and left sides of the mask horizontally inserted from the front;

an operating member capable of movement operation in a front-back direction with respect to the right and left side support part, a rod member provided so as to extend in the front-back direction along a lateral part of the right and left side support part so that a front end of the rod member is joined to the operating member;

a back edge stopper that is joined to a back end of the rod member and is moved in the front-back direction through the rod member by the movement operation in the front-back direction with respect to the right and left side support part by the operating member and is fixed to the right and left side support part by fixing operation of the rod member to the right and left side support part by the operating member and is abutted on a back edge of the mask whose both right and left sides are supported by the right and left side support parts; and a front edge stopper abutted on a front edge of the mask whose both right and left sides are supported by the right and left side support parts.

2. The mask holder as claimed in claim 1, wherein the front edge stopper is slidable on a shaft member provided on the right and left side support part so as to extend in the front-back direction, and is configured so as to be able to retract in a position in which the front edge stopper does not interfere with a mask by swinging the front edge stopper with respect to the shaft member at the time of inserting and withdrawing the mask into and from the right and left side support parts.

* * * * *